United States Patent
Yamaguchi et al.

(10) Patent No.: US 7,259,412 B2
(45) Date of Patent: Aug. 21, 2007

(54) SOLID STATE IMAGING DEVICE

(75) Inventors: Tetsuya Yamaguchi, Tokyo (JP);
Hiroshige Goto, Yokohama (JP);
Masayuki Ayabe, Yokohama (JP);
Hisanori Ihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 153 days.

(21) Appl. No.: 11/095,592

(22) Filed: Apr. 1, 2005

(65) Prior Publication Data

US 2005/0242385 A1    Nov. 3, 2005

(30) Foreign Application Priority Data

Apr. 30, 2004 (JP) .............. 2004-136584

(51) Int. Cl.
*H01L 29/76* (2006.01)

(52) U.S. Cl. .............. 257/291; 257/204; 257/369; 257/401; 257/443; 257/465

(58) Field of Classification Search ............... 257/191, 257/204, 291, 369, 401, 443, 465
See application file for complete search history.

(56) References Cited

U.S. PATENT DOCUMENTS 6,194,244 B1    2/2001  Yamaguchi et al.
6,344,670 B2    2/2002  Yamaguchi et al.
6,627,476 B2    9/2003  Kawakami et al.
6,690,423 B1 *  2/2004  Nakamura et al. .......... 348/311
2004/0108502 A1 6/2004  Nakamura et al.
2005/0242385 A1 11/2005 Yamaguchi et al.

FOREIGN PATENT DOCUMENTS

JP    2003-282857    10/2003

OTHER PUBLICATIONS

U.S. Appl. No. 11/387,819, filed Mar. 24, 2006, Nakamura et al.

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

A solid state imaging device includes a substrate of a first conductivity type. A transistor, which includes a first gate electrode and a first and second impurity areas, is provided on a surface of the substrate. The first and second impurity areas are formed in the surface of the substrate and sandwich a region under the first gate electrode. A third impurity area of a second conductivity type is formed in the surface of the substrate and spaced from the second impurity area at an opposite side to the first gate electrode. A fourth impurity area is formed under the second impurity area and connected to the third impurity area. A second gate electrode is provided above the substrate. A fifth impurity area of the second conductivity type is formed in the surface of the substrate. The third and fifth impurity areas sandwich a region under the second gate electrode.

15 Claims, 2 Drawing Sheets

SOLID STATE IMAGING DEVICE

CROSS-REFERENCE TO RELATED APPLICATIONS

This application is based upon and claims the benefit of priority from prior Japanese Patent Application No. 2004-136584, filed Apr. 30, 2004, the entire contents of which are incorporated herein by reference.

BACKGROUND OF THE INVENTION

1. Field of the Invention

The present invention relates to a solid state imaging device, and more particularly, to a solid state imaging device having its improved sensitivity.

2. Description of the Related Art

As an imaging device, a so-called complementary metal oxide semiconductor (CMOS) sensor is known. The CMOS sensor has unit cells arranged therein. Each of the unit cells is composed of a photoelectric converter (photodiode), a readout transistor, a reset transistor, an amplifier transistor, and a selector transistor. The readout transistor reads out a signal from the photoelectric converter. The reset transistor resets a signal electric charge. The amplifier transistor amplifies a signal. The selector transistor selects a line.

In order to increase the sensitivity of the photodiode, Jpn. Pat. Appln. KOKAI Publication No. 2003-282857 has proposed a structure in which the photodiode extends under a detector section of one's own pixel. One pixel is defined as a region which a light beam enters and in which the photodiode carries out photoelectric conversion and a transistor for processing the signal electric charge is formed.

In this case, the photodiode is formed under the readout transistor. Thus, in order to stably make an operation of the readout transistor, in general, it is necessary to form a semiconductor layer whose conductivity type is opposite to the photodiode under the readout transistor. This is because, if such a semiconductor layer (p-type) whose conductivity type is opposite to the photodiode (n-type semiconductor layer in this case) is not formed under the readout transistor, the photodiode and the detector section (conductive semiconductor layer having the same conductivity type as the photodiode: n-type in this case) may be electrically connected to each other.

However, if the semiconductor layer with a conductivity type (p-type) opposite to the photodiode is formed under the readout transistor, a need for adjusting a threshold value of the readout transistor arises. This is one of the factors of narrowing an operating margin of the readout transistor and unstable device operation.

BRIEF SUMMARY OF THE INVENTION

According to a first aspect of the present invention, there is provided a solid state imaging device, comprising: a semiconductor substrate of a first conductivity type; a transistor provided on a surface of the substrate, the transistor including a first gate electrode provided above the substrate, a first impurity area and a second impurity area, the first impurity area and the second impurity area being formed in the surface of the substrate and sandwiching a region under the first gate electrode; a third impurity area of a second conductivity type formed in the surface of the substrate and spaced from the second impurity area at an opposite side to the first gate electrode; a fourth impurity area formed under the second impurity area and connected to the third impurity area; a second gate electrode provided above the substrate; and a fifth impurity area of the second conductivity type formed in the surface of the substrate, the third impurity area and the fifth impurity area sandwiching a region under the second gate electrode.

According to a first aspect of the present invention, there is provided a solid state imaging device, comprising: a semiconductor substrate or well of the first conductivity type; a first signal accumulator section of the second conductivity type formed in the vicinity of a surface of the substrate or well, and the first signal accumulator section accumulating a signal electric charge obtained by photoelectric conversion; a first gate electrode provided above the substrate or well and being adjacent to one end of the first signal accumulator section; a first drain area formed in the surface of the substrate or well and being adjacent to an opposite end to the first signal accumulator section of the first gate electrode; a second signal accumulator section of the second conductivity type formed in the vicinity of the surface of the substrate or well, and the second signal accumulator section being spaced from the first drain area at an opposite side to the first gate electrode, the second signal accumulator section accumulating a signal electric charge obtained by photoelectric conversion; a third signal accumulator section formed in the substrate or well under the first drain area and being connected to the second signal accumulator section; a second gate electrode provided above the substrate or well and being adjacent to an opposite end to the first drain area of the second signal accumulator section; and a second drain area formed in the surface of the substrate or well and being adjacent to an opposite end to the second signal accumulator section of the second gate electrode.

DETAILED DESCRIPTION OF THE INVENTION

Hereinafter, embodiments of the present invention will be described with reference to the accompanying drawings.

Figure 1:
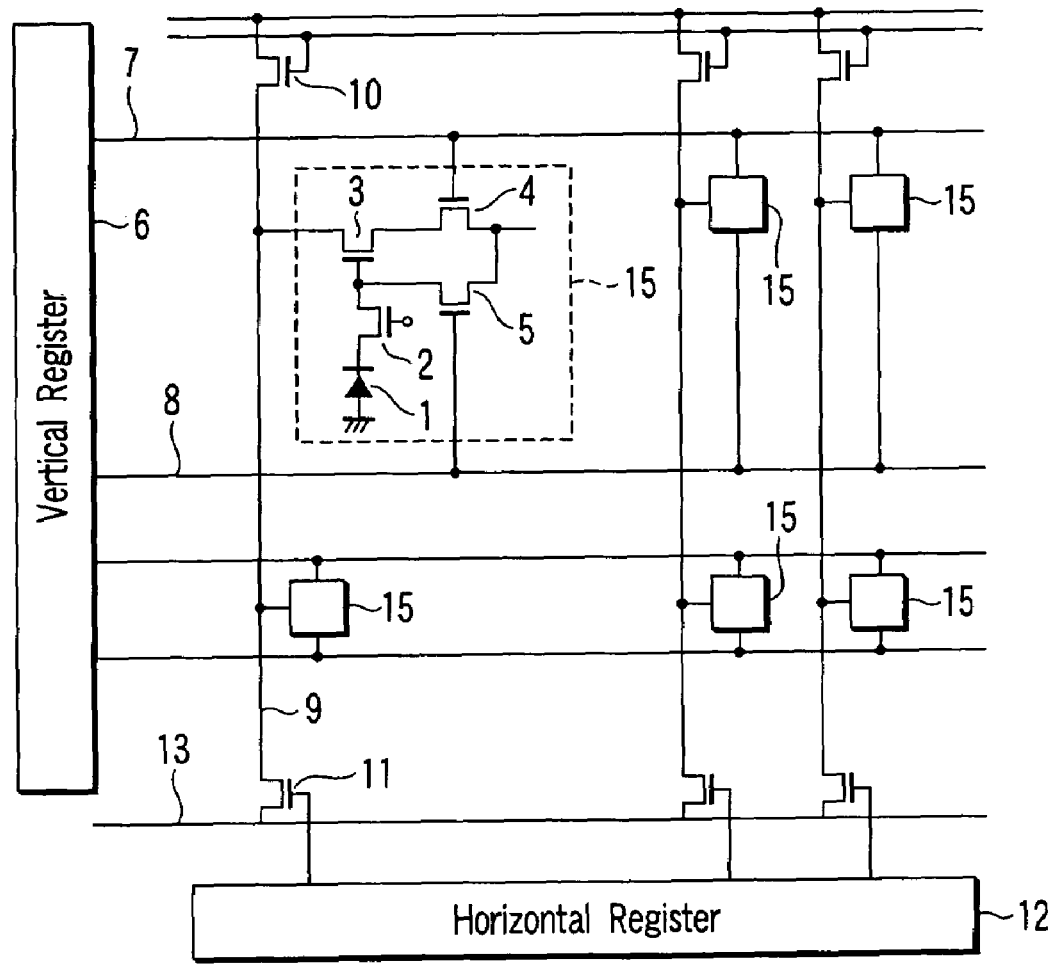
FIG. 1 is a view showing a circuit construction of a CMOS image sensor according to one embodiment of the present invention.

FIG. 1 is a view showing a circuit construction of a CMOS image sensor according to one embodiment of the invention. As shown in FIG. 1, unit cells 15 are arranged in a two-dimensional manner. Each of the unit cells 15 includes a photodiode (photoelectric converter) 1, a readout transistor 2, an amplifier transistor 3, a vertical selector transistor 4, and a reset transistor 5. Note that many more unit cells as those shown in FIG. 1 are actually arranged.

The photodiode 1 carries out photoelectric conversion. The readout transistor 2 reads out a signal electric charge from the photodiode 1. The amplifier transistor 3 amplifies the read signal electric charge. The vertical selector transistor 4 selects a line for reading out a signal. The reset transistor 5 resets a signal electric charge.

A horizontal address line 7 is wired in a horizontal direction from a vertical register 6. The horizontal address line 7 is connected to a gate of the vertical selector transistor 4 to determine the line for reading out a signal. A reset line 8 is connected to a gate of the reset transistor 5.

A source of the amplifier transistor 3 is connected to a vertical signal line 9. A load transistor 10 is provided at one end of the vertical signal line 9. The other end of the vertical signal line 9 is connected to a horizontal signal line 13 via a horizontal selector transistor 11. The horizontal selector transistor 11 is selected in accordance with a selection pulse supplied from a horizontal register 12.

Although a circuit construction is basically identical to that of a conventional device, the embodiment is different from the conventional device in a device structure.

Figure 2A:
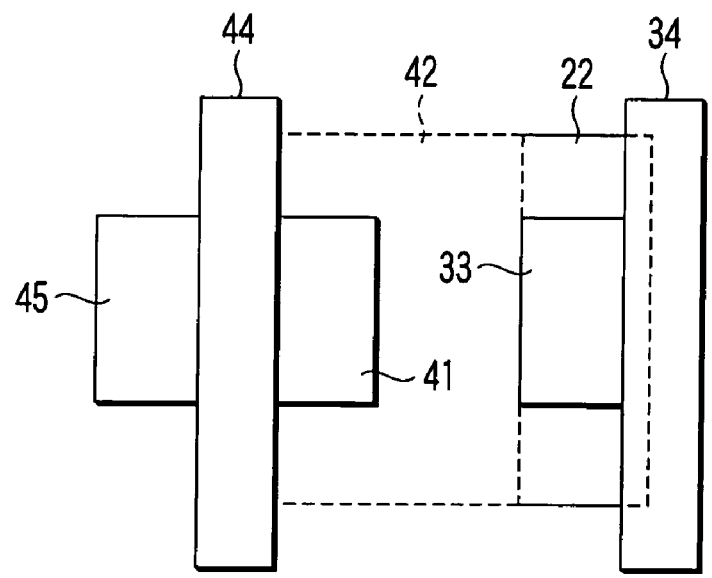
FIG. 2A is a plan view showing an device structure of a CMOS image sensor according to one embodiment of the invention.
Figure 2B:
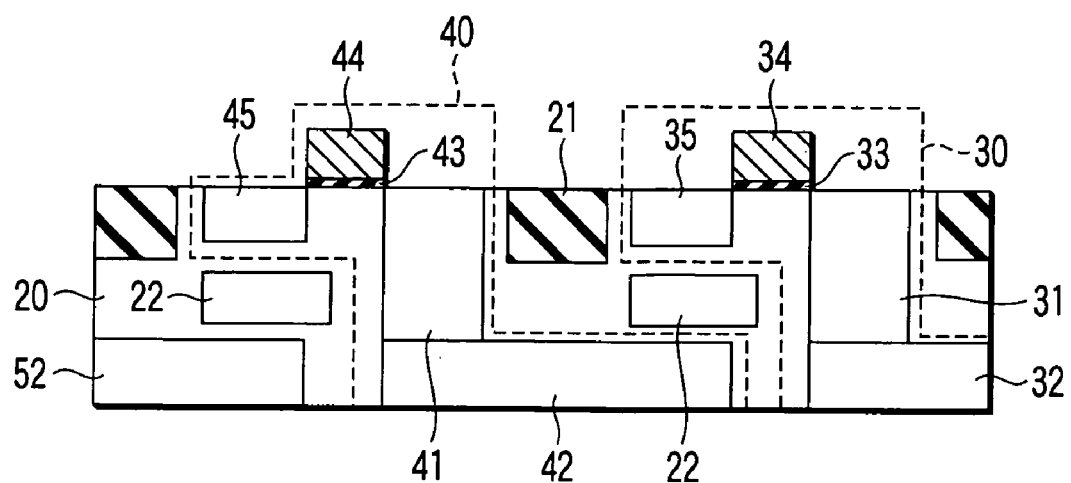
FIG. 2B is a sectional view showing a device structure of a CMOS image sensor according to one embodiment of the invention.

FIG. 2A is a plan view showing a device structure of a CMOS image sensor according to one embodiment of the invention. FIG. 2B is a sectional view showing a device structure of a CMOS image sensor according to one embodiment of the invention. Each of FIGS. 2A and 2B show a photodiode and a signal readout transistor in one unit cell portion (formed while one photodiode is included in one pixel).

As shown in FIGS. 2A and 2B, in the embodiment, a first signal accumulator section 31 and a second signal accumulator section 32 are provided inside a p-type Si substrate or a p-well 20. The first signal accumulator section 31 and the second signal accumulator section 32 constitute a photodiode and each of them is composed of an n-type diffusion layer which converts a light beam into an electric charge and accumulates it.

The first signal accumulator section 31 is formed in the vicinity of a surface of the p-type substrate/well (hereinafter p-type substrate/the well) 20. The second signal accumulator section 32 is formed in the p-type substrate/well 20, and is connected to the first signal accumulator section 31. The p-type substrate/well 20 and the second signal accumulator section 32 receive a light beam to generate photovoltaic voltage.

A gate electrode 34 is provided on the p-type substrate/well 20 via a gate insulation film 33 and is adjacent to one end of the first signal accumulator section 31. A drain area 35 is provided at a surface portion of the p-type substrate/well 20 at an opposite side to the signal accumulator section 31 of the gate electrode 34. The drain area 35 is composed of an n-type diffusion layer. A description of a configuration of the first pixel 30 configuring one pixel has now been completed.

Then, a configuration of a second pixel 40 adjacent to the first pixel 30 will be described. A first signal accumulator section 41 and a second signal accumulator section 42 are provided in the p-type substrate/well 20. The first signal accumulator section 41 and the second signal accumulator section 42 constitute a photodiode and each of them is composed of an n-type diffusion layer (impurity area) which converts a light beam into an electric charge and accumulates it. The p-type substrate/well 20 and the second signal accumulator section 42 receive a light beam to generate photovoltaic voltage.

The first signal accumulator section 41 is formed in the vicinity of a surface of the p-type substrate/well 20 and apart from one end opposite to the gate electrode 34 of the drain area 35. The second signal accumulator section 42 is formed in the p-type substrate/well 20 under the drain area 35 of the first pixel 30. The second signal accumulator section 42 is connected to the first signal accumulator section 41 of the pixel 40 to which the second signal accumulator section 42 itself belongs.

Adjacent to one end opposite to the drain area 35 of the first signal accumulator section 41, a gate electrode 44 is provided on the p-type substrate/well 20 via a gate insulation film 43. A drain area 45 is provided at a surface portion of the p-type substrate/well 20 at an opposite side to the first signal accumulator section 41 of the gate electrode 44. The drain area 45 is composed of an n-type diffusion layer (impurity area). A description of a configuration of the second pixel 40 configuring one pixel has now been completed.

The second signal accumulator section 42 is longer than the first signal accumulator section 41 in a longitudinal direction of the gate electrode 44.

A trench is formed in the p-type substrate/well 20 between the first pixel 30 and the second pixel 40. A device separation insulation film 21 is buried in the trench. Reference numeral 52 denotes a second signal accumulator section of the adjacent pixel.

A p-type punch through stopper layer 22 is formed between the drain area 35 of the first pixel 30 and the second signal accumulator section 42 of the second pixel 40 adjacent to the first pixel 30. The p-type impurity concentration of the punch through stopper layer 22 is higher than that of the substrate/well 20. The punch through stopper 22 separates the first pixel 30 and the second pixel 40 from each other. Therefore, an accumulation signal of the second signal accumulator section 42 of the second pixel 40 is not fed to the drain area 35 of the first pixel 30. In addition, a junction capacity between the punch through stopper layer 22 and the second signal accumulator section 42 can increases the capacity of the photodiode.

In the photodiode structure described above, the second signal accumulator section 42 of the second pixel 40 is formed under the drain area 35 of the adjacent pixel 30. Therefore, an effective area of the photodiode can be increased. Further, even if the second signal accumulator section 42 extends under the adjacent first pixel 30, a signal electric charge accumulated in the second signal accumulator section 42 is not read out during readout of a signal accumulated in the first pixel 30. Therefore, what should be considered is only isolating the second signal accumulator section 42 from the drain area 35 by the punch through stopper layer 22.

Further, in a structure of forming a signal accumulator section under a detector section of the adjacent pixel, a signal accumulator section of a pixel is not formed under the gate electrode of the transistor of its own pixel. Therefore, there is no need for forming a semiconductor layer whose conductivity type is opposite to a signal accumulator section under the gate electrode. Further, there is no need for adjusting a threshold value of the readout transistor. Therefore, an operating margin of the readout transistor is not narrowed, and a device operation can be stabilized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid state imaging device, comprising:
   a semiconductor substrate of a first conductivity type;
   a transistor provided on a surface of the substrate, the transistor including a first gate electrode provided above the substrate, a first impurity area of a second conductivity type and a second impurity area of the second conductivity type, the first impurity area and the second impurity area being formed in the surface of the substrate and sandwiching a region under the first gate electrode;

a third impurity area of the second conductivity type formed in the surface of the substrate and spaced from the second impurity area at an opposite side to the first gate electrode;

a fourth impurity area of the second conductivity type formed under the second impurity area and connected to the third impurity area, the fourth impurity area being out of contact with the second impurity area;

a second gate electrode provided above the substrate; and a fifth impurity area of the second conductivity type formed in the surface of the substrate, the third impurity area and the fifth impurity area sandwiching a region under the second gate electrode.

2. The solid state imaging device according to claim 1, wherein the third impurity area accumulates a signal electric charge obtained by photoelectric conversion.

3. The solid state imaging device according to claim 1, wherein the fourth impurity area formed under the second impurity area is not formed under the second gate electrode.

4. The solid state imaging device according to claim 1, further comprising a device isolating insulation film formed in the surface of the substrate between the second impurity area and the third impurity area.

5. The solid state imaging device according to claim 1, further comprising a semiconductor layer of the first conductivity type formed between the second impurity area and the fourth impurity area and being higher than the substrate in a first conductivity type impurity concentration.

6. The solid state imaging device according to claim 5, wherein the semiconductor layer is not formed under the second gate electrode.

7. A solid state imaging device, comprising:

a semiconductor substrate or well of the first conductivity type;

a first signal accumulator section of the second conductivity type formed in the vicinity of a surface of the substrate or well, and the first signal accumulator section accumulating a signal electric charge obtained by photoelectric conversion;

a first gate electrode provided above the substrate or well and being adjacent to one end of the first signal accumulator section;

a first drain area of the second conductivity type formed in the surface of the substrate or well and being adjacent to an opposite end to the first signal accumulator section of the first gate electrode;

a second signal accumulator section of the second conductivity type formed in the vicinity of the surface of the substrate or well, and the second signal accumulator section being spaced from the first drain area at an opposite side to the first gate electrode, the second signal accumulator section accumulating a signal electric charge obtained by photoelectric conversion;

a third signal accumulator section of the second conductivity type formed in the substrate or well under the first drain area and being connected to the second signal accumulator section, the third signal accumulator section being out of contact with the first drain area;

a second gate electrode provided above the substrate or well and being adjacent to an opposite end to the first drain area of the second signal accumulator section; and a second drain area of the second conductivity type formed in the surface of the substrate or well and being adjacent to an opposite end to the second signal accumulator section of the second gate electrode.

8. The solid state imaging device according to claim 7, wherein the third signal accumulator section formed under the first drain area is not formed under the second gate electrode.

9. The solid state imaging device according to claim 7, further comprising a device isolating insulation film formed in the surface of the substrate or well between the first drain area and the second signal accumulator section.

10. The solid state imaging device according to claim 7, further comprising a semiconductor layer of the first conductivity type formed between the first drain area and the third signal accumulator section and being higher than the substrate in a first conductivity type impurity concentration.

11. The solid state imaging device according to claim 10, wherein the semiconductor layer is not formed under the second gate electrode.

12. The solid state imaging device according to claim 1, wherein the fourth impurity area is out of contact with the first impurity area and the fifth impurity area.

13. The solid state imaging device according to claim 1, wherein the third impurity area has a bottom which reaches deeper than a bottom of the second impurity area and a bottom of the fifth impurity area and which is connected to the fourth impurity area.

14. The solid state imaging device according to claim 7, wherein the third signal accumulator section is out of contact with the first signal accumulator section and the second drain area.

15. The solid state imaging device according to claim 7, wherein the second signal accumulator section has a bottom which reaches deeper than a bottom of the first drain area and a bottom of the second drain area and which is connected to the third signal accumulator section.

* * * * *